United States Patent
Chen et al.

(10) Patent No.: US 10,312,472 B2
(45) Date of Patent: Jun. 4, 2019

(54) DISPLAY PANEL

(71) Applicant: AU Optronics Corporation, Hsin-Chu (TW)

(72) Inventors: Yi-Hong Chen, Taichung (TW); Chung-Chia Chen, New Taipei (TW); Meng-Ting Lee, Taipei (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 16/000,187

(22) Filed: Jun. 5, 2018

(65) Prior Publication Data

US 2018/0358579 A1 Dec. 13, 2018

(30) Foreign Application Priority Data

Jun. 13, 2017 (TW) .............................. 106119692 A

(51) Int. Cl.
*H01L 27/32* (2006.01)
*H01L 51/52* (2006.01)

(52) U.S. Cl.
CPC ........ *H01L 51/5271* (2013.01); *H01L 27/322* (2013.01); *H01L 27/3244* (2013.01); *H01L 27/3246* (2013.01); *H01L 27/3272* (2013.01); *H01L 27/3283* (2013.01); *H01L 27/3295* (2013.01); *H01L 51/5281* (2013.01)

(58) Field of Classification Search
None
See application file for complete search history.

(56) References Cited

U.S. PATENT DOCUMENTS

| 6,392,340 | B2 | 5/2002 | Yoneda et al. |
| 7,348,207 | B2 | 3/2008 | Kobayashi |
| 8,803,415 | B2 | 8/2014 | Lee et al. |
| 9,627,452 | B2 * | 4/2017 | Lim ...................... H01L 27/322 |
| 10,069,113 | B2 * | 9/2018 | Lee ..................... H01L 51/5281 |
| 2011/0220924 | A1 | 9/2011 | Fukuda |
| 2016/0380037 | A1 * | 12/2016 | Kajiyama ........... H01L 27/3262 257/88 |
| 2018/0277609 | A1 * | 9/2018 | Fukiwara ................. G02B 5/20 |

FOREIGN PATENT DOCUMENTS

TW I413449 10/2013

* cited by examiner

*Primary Examiner* — Minh Loan Tran
(74) *Attorney, Agent, or Firm* — WPAT, PC

(57) ABSTRACT

A display panel includes a pixel array layer and a light-blocking layer. The pixel array layer has a plurality of pixel blocks, and each pixel block has a first side. The light-blocking layer disposed above the pixel array layer and has a plurality of first light-blocking belts corresponding to the pixel blocks. The first light-blocking belt at least partially extends along the first side of its corresponding pixel block. Accordingly, the outgoing light emitted at a larger angle from the pixel blocks can be at least partially blocked.

9 Claims, 7 Drawing Sheets

DISPLAY PANEL

BACKGROUND OF THE INVENTION

1. Field of the Invention

The present invention generally relates to a display panel. Particularly, the present invention relates to a display panel capable of reducing the amount of large-angled outgoing light on a side of the display panel.

2. Description of the Prior Art

Flat display devices and curved display devices are widely applied to a variety of electronic devices, such as mobile phone, personal wearable device, television, host computer for transportation equipment, personal computer, digital camera, palm gaming device, and so on. However, when the display devices are used on different electronic devices, different problems will be occurred on different uses.

Taking the host computer for vehicles as an example, the conventional car computer usually includes a display panel to display information or images. However, as shown in FIG. 1, the display panel 1 is generally disposed on the lower side of the windshield 3. Because the windshield 3 is disposed with a titled angle, the outgoing light 5 large-angled emitted from the display panel 1 will project to the inner surface of the windshield 3. Consequently, the large-angled outgoing light 5 is likely to be reflected from the windshield 3 to the driver and affects the line of view of the driver. Especially, when the environment is a dark or dim light environment, the visual interference will become more serious and affects the driving safety.

SUMMARY OF THE INVENTION

It is an object of the invention to provide a display panel capable of reducing the amount of larger-angled outgoing light on a side of the display panel.

It is another object of the invention to provide a display panel, wherein when the display panel is disposed on the host computer for transportation equipment, the visual interference caused by reflections from the windshield can be reduced.

The display panel includes a pixel array layer and a light-blocking layer. The pixel array layer has a plurality of pixel blocks, and each of the pixel blocks has a first side. The light-blocking layer is disposed above the pixel array layer and has a plurality of first light-blocking belts corresponding to the pixel blocks. Each of the first light-blocking belts at least partially extends along the first side of its corresponding pixel block.

When a vertical projection of the first light-blocking belt on the pixel array layer falls outside the first side of its corresponding pixel block and does not overlap the first side of its corresponding pixel block, the relative position of the pixel array layer and the light-blocking layer satisfies the following equation:

$$(H \times \tan 30° - D_1)/W \geq 70\%$$

wherein:
$D_1$: a distance between the vertical projection of the first light-blocking belt on the pixel array layer and the first side in a direction perpendicular to the first side;
H: a distance between the first light-blocking belt and its corresponding pixel block in a direction perpendicular to the pixel array layer; and
W: a width of the pixel block in the direction perpendicular to the first side.

When the vertical projection of the first light-blocking belt on the pixel array layer overlaps the first side of its corresponding pixel block, the relative position of the pixel array layer and the light-blocking layer satisfies the following equation:

$$(H \times \tan 30° + D_0)/W \geq 70\%$$

wherein:
$D_0$: a width of an overlapping area of the vertical projection of the first light-blocking belt on the pixel array layer and the pixel block in the direction perpendicular to the first side;
H: a distance between the first light-blocking belt and its corresponding pixel block in the direction perpendicular to the pixel array layer; and
W: a width of the pixel block in the direction perpendicular to the first side.

With such a design, if the first light-blocking belt is located above its corresponding pixel block, the outgoing light large-angled emitted from the pixel block will be at least partially blocked. At the same time, the outgoing light emitted at an angle substantially perpendicular to the display surface is less likely to be blocked. When the display panel of the invention is applied to a display device for vehicle, it is possible to reduce the upward light emitted at a larger angle and to reduce the reflection of the larger-angled outgoing light on the windshield.

DETAILED DESCRIPTION OF THE PREFERRED EMBODIMENT

The present invention provides a display panel, such as a self-luminous display panel, but not limited thereto. The display panel can be applied to a car display or a host computer for transportation equipment, and can also be applied to other display devices, such as computer display device, television, monitor, etc. In addition, the display panel can be applied to the display module of other electronic devices, such as the display screen of mobile phone, digital camera, pocket gaming device, etc.

Figure 1:
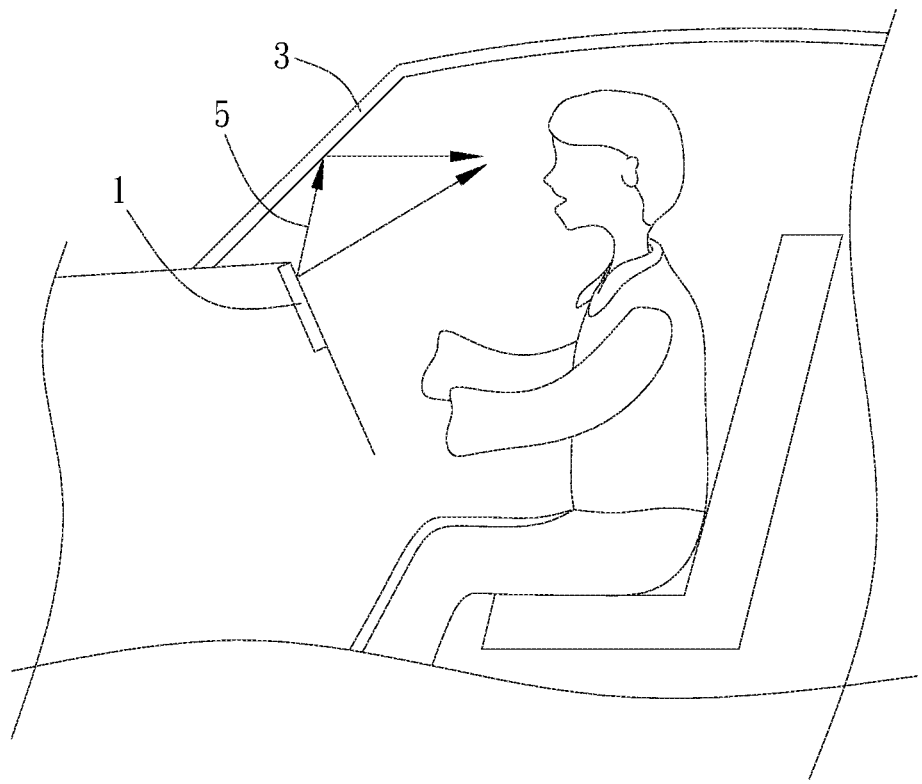
FIG. 1 is a schematic view of a conventional display panel for car computer.
Figure 2:
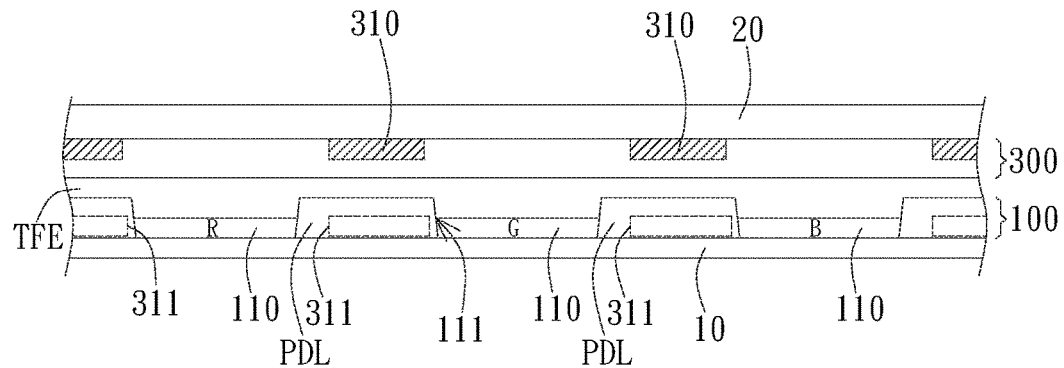
FIG. 2 is a schematic side view of an embodiment of the display panel of the invention.
Figure 3:
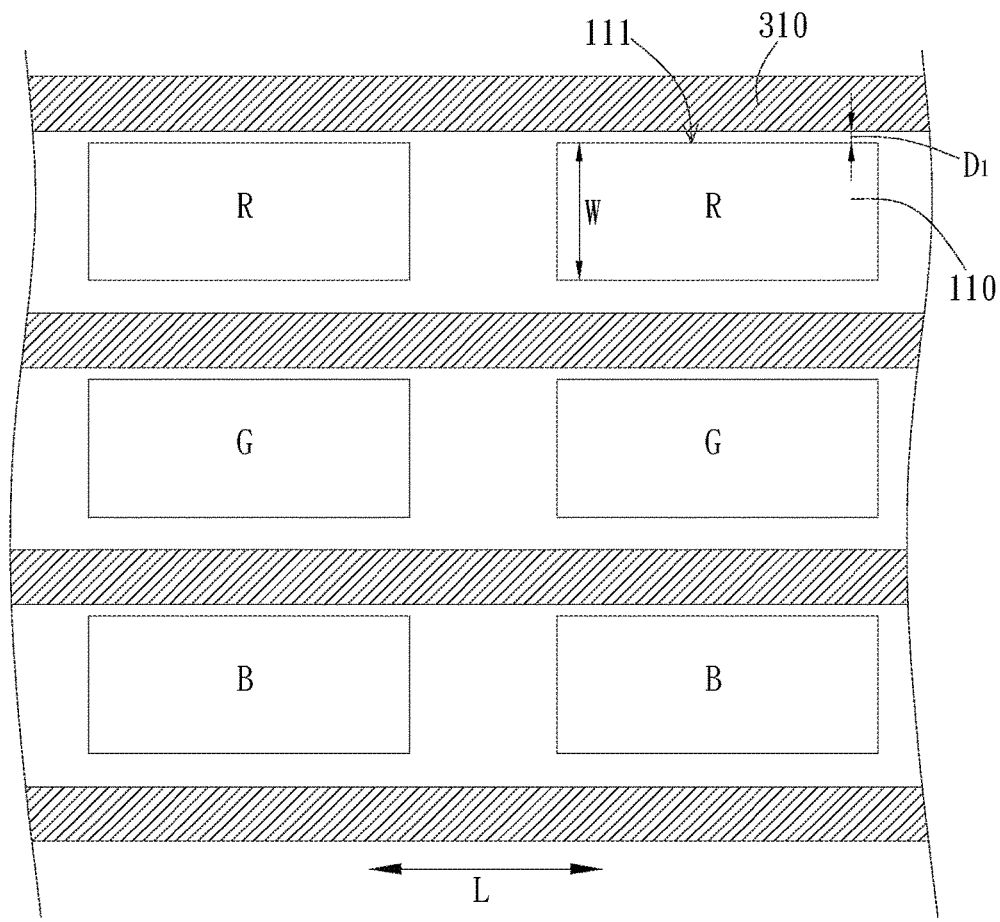
FIG. 3 is a schematic top view of the embodiment of FIG. 2.

FIG. 2 is a schematic side view of an embodiment of the display panel of the invention. FIG. 3 is a schematic top view of the embodiment of FIG. 2. It is noted that FIG. 3 merely illustrates pixel blocks and first light-blocking belts but omits other layers in order to clearly express the relative relationship. As shown in FIG. 2 and FIG. 3, the display panel includes a pixel array layer 100 and a light-blocking layer 300. In an embodiment, the pixel array layer 100 is disposed on a first substrate 10 and includes a plurality of pixel blocks 110. The pixel blocks 110 are distributed in an array. In an embodiment, the pixel blocks 110 are arranged in columns and rows along straight lines. In an embodiment, the pixel blocks 110 can be formed by self-luminous light sources, such as organic light-emitting diodes (OLEDs). In other words, each pixel block 110 can be an image pixel formed by the OLED. For example, a pixel defining layer (PDL) can define a plurality of blocks on the first substrate 10; OLED materials can be filled therein to form each pixel block 110 and then covered with thin film encapsulation (TFE) materials. However, in a different embodiment, the pixel blocks 110 can be not self-luminous, and the image display is performed incorporation with a backlight module or environment light. In addition, the pixel blocks 110 can have different colors and are sequentially arranged in columns or rows in accordance with the color, such as red, green, blue, but not limited thereto. The pixel blocks 110 can be arranged in different colors, different orders, or different patterns according to practical needs.

As shown in FIG. 2 and FIG. 3, the light-blocking layer 300 is disposed above the pixel array layer 100. In this embodiment, the light-blocking layer 300 is disposed on a second substrate 20 and then arranged above the first substrate 10 on which the pixel array layer 100 is disposed, so the pixel array layer 100 and the light-blocking layer 300 are sandwiched between the first substrate 10 and the second substrate 20. The light-blocking layer 300 has a plurality of first light-blocking belts 310 corresponding to the pixel blocks 110. In this embodiment, a same first light-blocking belt 310 corresponds to a plurality of pixel blocks 110 that are substantially arranged in a straight line. In other words, a same light-blocking belt 310 corresponds to the pixel blocks in a same column or a same row. Specifically, each of the pixel blocks 110 has a first side 111. The first light-blocking belt 310 at least partially extends along the first sides 111 of its corresponding pixel blocks 110, and these pixel blocks 110 are arranged along the extending direction of the first sides 111. In other words, at least a portion of the pixel blocks 110 are arranged along a direction parallel to the first side 111 and correspond to a same first light-blocking belt 310. Moreover, in the embodiment of FIG. 3, the pixel block 110 is formed in a rectangular shape or a strip shape. The extending direction L of the rectangular or strip-shaped pixel block 110 is substantially parallel to the extending direction of the first side 111, so as to achieve a better light-shielding effect on the large-angled light. In addition, the first side 111 can be a side edge of the top surface of the pixel block 110.

Figure 4:
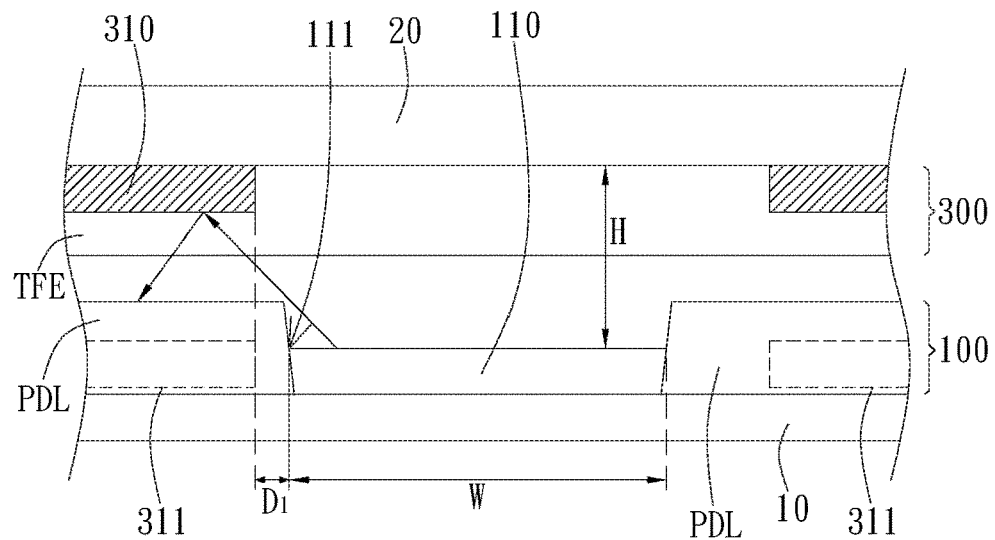
FIG. 4 is a schematic partially enlarged view of the embodiment of FIG. 2.

FIG. 4 is a schematic partially enlarged view of the embodiment of FIG. 2. In the embodiment of FIG. 4, the vertical projection of the first light-blocking belt 310 on the pixel array layer 100 falls outside the first side 111 of each of its corresponding pixel blocks 110 and does not overlap the first side 111 of each of its corresponding pixel blocks 110. Compared to the non-corresponding pixel blocks 110, the vertical projection 311 of the first light-blocking belt 310 on the pixel array layer 100 has the nearest distance from the first side 111 of each of its corresponding pixel blocks 110. In this embodiment, the relative position of the pixel array layer 100 and the light-blocking layer 300 satisfies the following equation:

$$(H \times \tan 30° - D_1)/W \geq 70\%$$

wherein:

$D_1$: a distance between the vertical projection 311 of the first light-blocking belt 310 on the pixel array layer 100 and the first side 111 in a direction perpendicular to the first side 111;
H: a distance between the first light-blocking belt 310 and its corresponding pixel block 110 in a direction perpendicular to the pixel array layer 100; and
W: a width of the pixel block 110 in the direction perpendicular to the first side 111.

Figure 5:
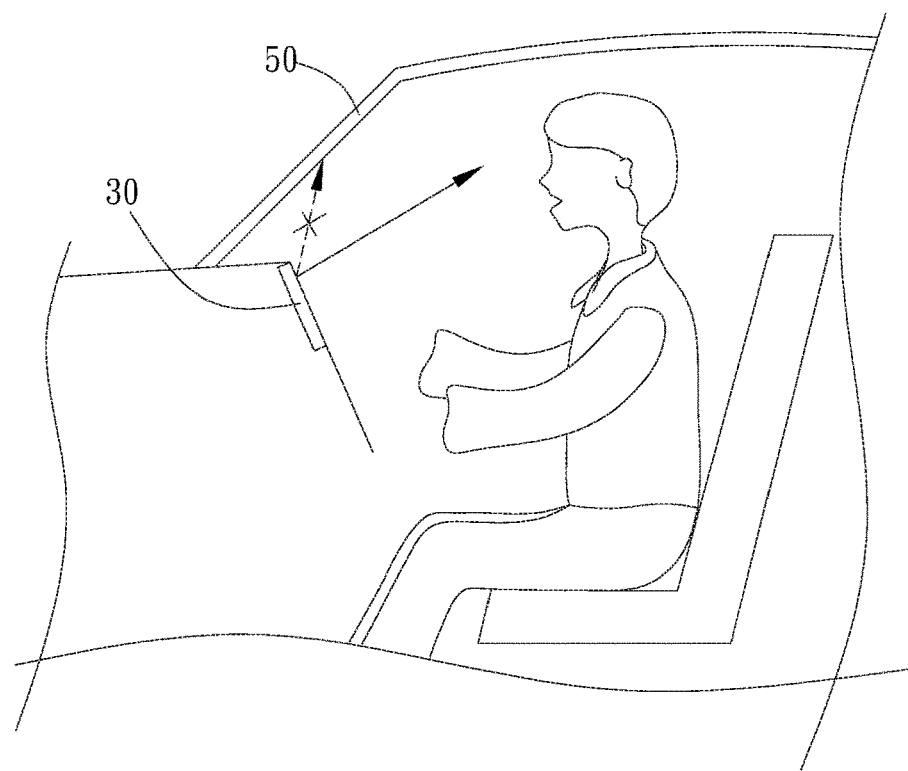
FIG. 5 is a schematic view of an embodiment of the display panel used in a car computer.

As shown in FIG. 4, with such a design, when the first light-blocking belt 310 is located above its corresponding pixel blocks 110, the light emitted at a larger angle, such as an angle deviated from the normal line of display surface by 30 degrees or more, emitted upward from the pixel blocks 110 will be partially blocked, and the light emitted at an angle substantially perpendicular to the display surface is likely not to be blocked. As shown in FIG. 5, when the display panel 30 is applied to a car display device, the amount of light emitted upward at a larger angle will be reduced. Accordingly, the problem caused by reflections of light emitted at a larger angle on the windshield 50 will be alleviated, while the display brightness viewing at an angle substantially perpendicular to the display surface can be maintained.

Figure 6A:
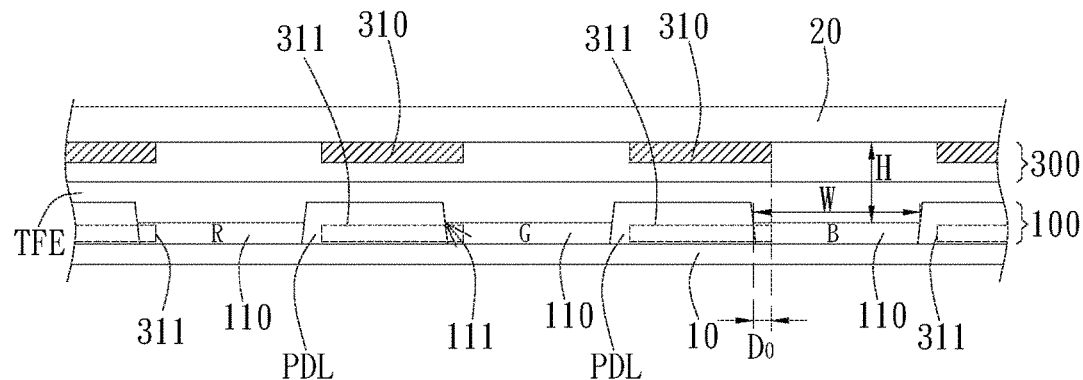
FIG. 6A is a schematic side view of another embodiment of the display panel.
Figure 6B:
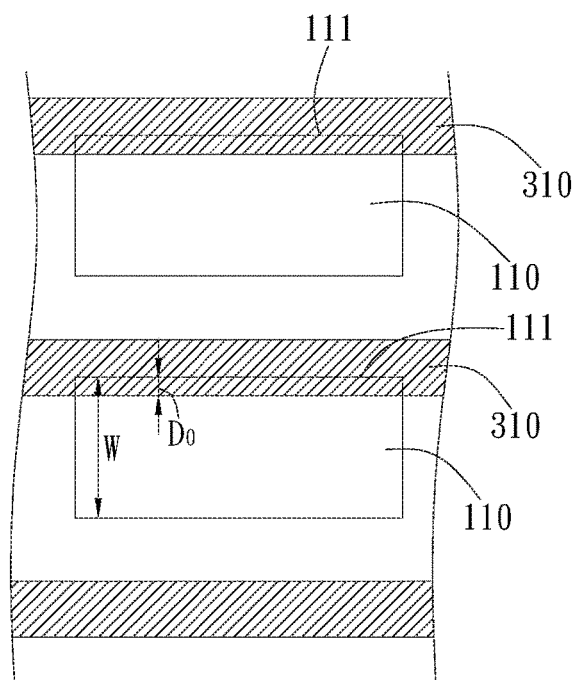
FIG. 6B is a schematic top view of the embodiment of FIG. 6A.

FIG. 6A is a schematic view of another embodiment of the display panel. FIG. 6B is a schematic top view of the embodiment of FIG. 6A. It is noted that FIG. 6B merely illustrates pixel blocks and first light-blocking belts but omits other layers in order to clearly express the relative relationship. In this embodiment, the vertical projection 311 of the first light-blocking belt 310 on the pixel array layer 100 overlaps the first side 111 of its corresponding pixel block(s) 110. In this embodiment, the relative position of the pixel array layer 100 and the light-blocking layer 300 satisfies the following equation:

$$(H \times \tan 30° + D_0)/W \geq 70\%$$

wherein:

$D_0$: a width of an overlapping area of the vertical projection 311 of the first light-blocking belt 310 on the pixel array layer 100 and the pixel block 110 in the direction perpendicular to the first side 111;
H: a distance between the first light-blocking belt 310 and its corresponding pixel blocks 110 in the direction perpendicular to the pixel array layer 100; and
W: a width of the pixel block 110 in the direction perpendicular to the first side 111.

As shown in FIG. 6A and FIG. 6B, with such a design, when the first light-blocking belt 310 is located above its corresponding pixel block(s) 110, the large-angled light emitted upward from the pixel block 110 will be partially blocked. Similarly, when the display panel is applied to a car display device, the effect of reducing the reflection of light on the windshield can be achieved.

It is noted that in the embodiments of FIGS. 4 and 6, the distance H between the first light-blocking belt 310 and its corresponding pixel block(s) 110 in the direction perpendicular to the pixel array layer 100 is a distance from the top surface of the first light-blocking belt 310 to the top surface of the pixel block 110.

Figure 7:
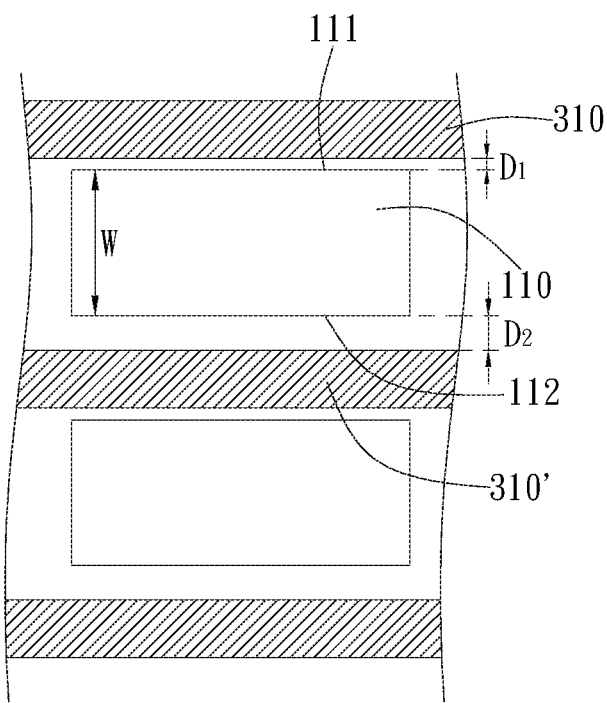
FIG. 7 is a schematic top view of another embodiment of the display panel.

FIG. 7 is a schematic top view of another embodiment of the display panel. In the embodiment of FIG. 7, the pixel block 110 further has a second side 112 opposite to the first side 111. Particularly, as shown in FIG. 7, each of the first light-blocking belts 310 corresponds to the pixel blocks 110 that are arranged in a row and is located above its corresponding pixel blocks 110 in the same row. Since the pixel array layer 100 includes the pixel blocks 110 that are arranged from top to bottom in multiple rows, the light-blocking layer 300 accordingly includes multiple first light-blocking belts 310 that are also arranged from top to bottom. As shown in FIG. 7, the upper side of the pixel block 110 is the first side 111 and is closest to its corresponding first light-blocking belt 310, and the lower side of the pixel block 110 is the second side 112 and is closest to the next first light-blocking belt 310'. In this embodiment, the distance $D_2$ is between the second side 112 and the vertical projection of the closest first light-blocking belt 310' on the pixel array layer 100 in the direction perpendicular to the second side 112, and the distance D2 is larger than the distance $D_1$. With such a design, it is ensured that the chance of the upward light being blocked is higher than that of the downward light being blocked.

Figure 8:
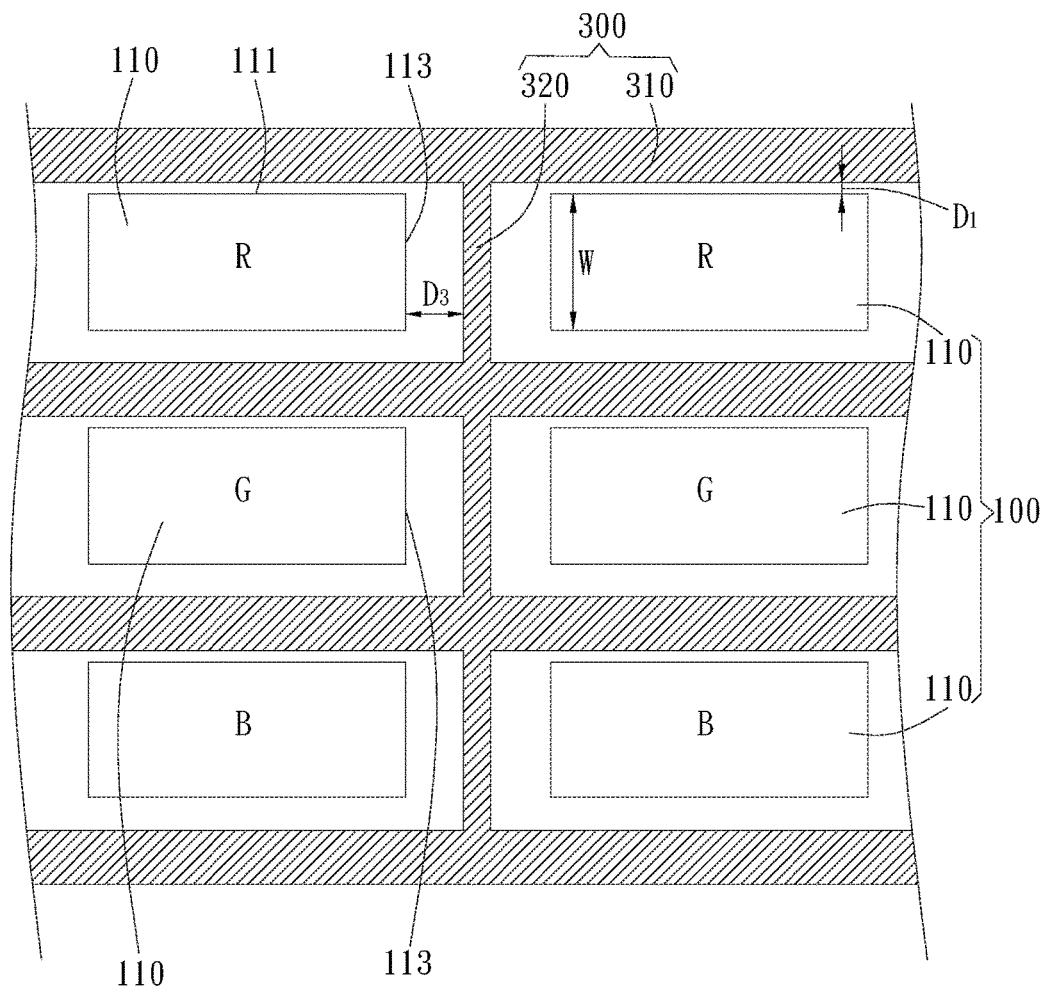
FIG. 8 is a schematic top view of another embodiment of the display panel.

FIG. 8 is a schematic top view of another embodiment of the display panel. In this embodiment, the pixel block 110 further has a third side 113, which is substantially perpendicular to the first side 111. The light-blocking layer 300 has a plurality of second light-blocking belts 320 corresponding to the pixel blocks 110 and at least extending along the third sides 113 of its corresponding pixel blocks 110. Particularly, as shown in FIG. 8, the pixel array layer 100 includes a plurality of pixel blocks 110 arranged in rows and columns. Each of the first light-blocking belts 310 extends along the row to correspond to the pixel blocks 110 that are arranged along the first sides 111. Each of the second light-blocking belts 320 extends along the column to correspond to the pixel blocks 110 that are arranged along the third sides 113. In an embodiment, the vertical projection of the second light-blocking belt 320 on the pixel array layer 100 falls between two columns of pixel blocks 110. For example, the vertical projection of the second light-blocking belt 320 on the pixel array layer 100 is located near the middle of two adjacent columns of pixel blocks 110, so the brightness on two sides is approximately the same, but not limited thereto. The distance $D_3$ is between the third side 113 and the vertical projection of its corresponding second light-blocking belt 320, i.e. the closest second light-blocking belt 320, on the pixel array layer 100 in the direction perpendicular to the third side 113, and the distance $D_3$ is larger than the distance $D_1$. With such a design, the upward outgoing light emitted at a larger angle can be at least partially blocked, and a larger display angle on two sides can be maintained. Moreover, the disposition of the second light-blocking belts 320 can reduce the reflection resulted from environment light emitting into the display panel and reduce the mix of light emitted from the pixel blocks 110 of different colors to promote the display quality.

Figure 9:
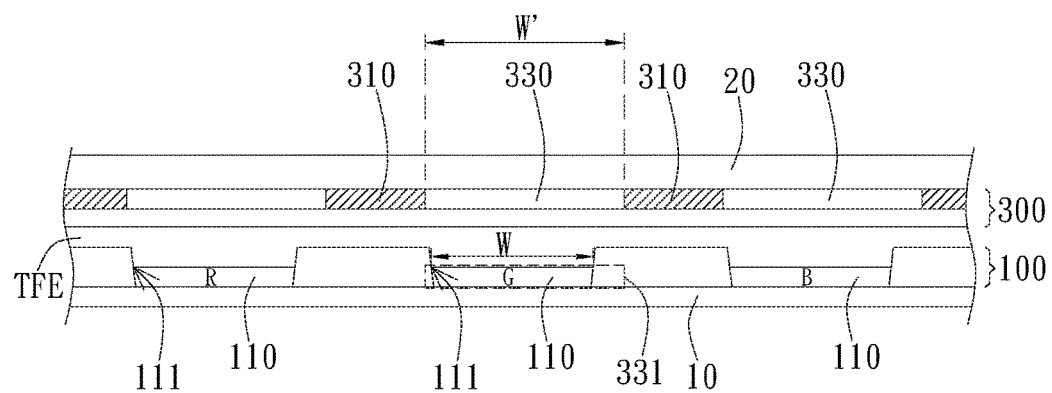
FIG. 9 is a schematic side view of another embodiment of the display panel.

FIG. 9 is a schematic side view of another embodiment of the display panel. As shown in FIG. 9, the light-blocking layer 300 further includes a plurality of color filtering blocks 330 distributed between adjacent first light-blocking belts 310. The vertical projection of the color filtering block 330 on the pixel layer 100 at least partially overlaps its corresponding pixel block(s) 110. In an embodiment, the width W' of the vertical projection 331 of the color filtering block 330 on the pixel array layer 100 is larger than the width W of its corresponding pixel block(s) 110 in the direction perpendicular to the first side 111. The color of the color filtering block 330 corresponds to the color of its corresponding pixel block(s) 110. For example, when the pixel block 110 is an organic light-emitting diode which emits red light, the corresponding color filtering block 330 is a red filter layer to filter out other color of light emitted from the pixel block 110. In a different embodiment, the pixel blocks 110 that emit white light can correspond to any color filtering blocks 330.

Figure 10:
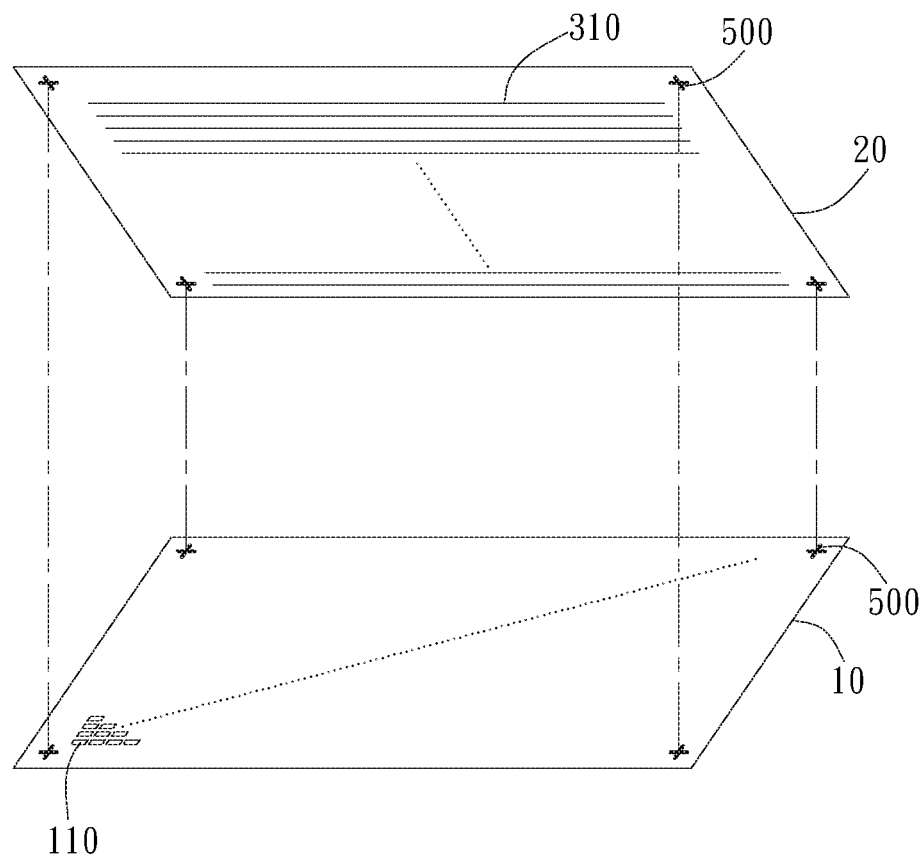
FIG. 10 is a schematic exploded view of an embodiment of the display panel.

FIG. 10 is an exploded view of an embodiment of the display panel. As shown in FIG. 10, the first substrate 10 and the second substrate 20 may have alignment marks 500, respectively. When the first substrate 10 is aligned with the second substrate 20, the alignment marks 500 on the first substrate 10 and the second substrate 20 are firstly aligned by naked eyes, optical detections, or other methods to ensure the relative position of the pixel blocks 110 and the first light-blocking belts 310 is correct. In a different embodiment, the alignment mark 500 can be disposed only on the first substrate 10 or the second substrate 20, so the substrate with the alignment mark 500 is aligned with other elements on the substrate without the alignment mark to ensure the relative position of the first substrate 10 and the second substrate 20 is in a tolerance range. The pattern, size, location of the alignment mark 500 can be modified according to design needs, not limited to the embodiment.

Although the preferred embodiments of present invention have been described herein, the above description is merely illustrative. The preferred embodiments disclosed will not limit the scope of the present invention. Further modification of the invention herein disclosed will occur to those skilled in the respective arts and all such modifications are deemed to be within the scope of the invention as defined by the appended claims.

What is claimed is:
1. A display panel, comprising:
a pixel array layer having a plurality of pixel blocks, each of the pixel blocks having a first side;
a light-blocking layer disposed above the pixel array layer, the light-blocking layer having a plurality of first light-blocking belts corresponding to the pixel blocks, each of the first light-blocking belts at least partially extending along the first side of its corresponding pixel block;
wherein when a vertical projection of the first light-blocking belt on the pixel array layer does not overlap the first side of its corresponding pixel block, the following equation exists:

$(H \times \tan 30° - D_1)/W \geq 70\%$ wherein when the vertical projection of the first light-blocking belt on the pixel array layer overlaps the first side of its corresponding pixel block, the following equation exists:

$(H \times \tan 30° + D_0)/W \geq 70\%$ wherein:
$D_1$: a distance between the vertical projection of the first light-blocking belt on the pixel array layer and the first side of its corresponding pixel block in a direction perpendicular to the first side;
$D_0$: a width of an overlapping area of the vertical projection of the first light-blocking belt on the pixel array layer and the pixel block in the direction perpendicular to the first side;

H: a distance between the first light-blocking belt and its corresponding pixel block in a direction perpendicular to the pixel array layer; and W: a width of the pixel block in the direction perpendicular to the first side.

2. The display panel of claim 1, wherein the pixel block has an extending direction; the extending direction is substantially parallel to an extending direction of the first side.

3. The display panel of claim 1, wherein the pixel block has a second side opposite to the first side; a distance $D_2$ is between the second side and the vertical projection of a closest first light-blocking belt on the pixel array layer in a direction perpendicular to the second side; $D_2$ is larger than $D_1$.

4. The display panel of claim 1, wherein the pixel block has a third side substantially perpendicular to the first side; the light-blocking layer has a plurality of second light-blocking belts respectively corresponding to the pixel blocks; each of the second light-blocking belts at least partially extends along the third side of its corresponding pixel block; a distance $D_3$ is between the third side and the vertical projection of its corresponding second light-blocking belt on the pixel array layer in a direction perpendicular to the third side; $D_3$ is larger than $D_1$.

5. The display panel of claim 1, wherein the light-blocking layer has a plurality of color filtering blocks distributed between the first light-blocking belts, vertical projections of the color filtering blocks on the pixel array layer at least partially overlap the pixel blocks, respectively.

6. The display panel of claim 5, wherein a width of the vertical projection of each of the color filtering blocks on the pixel array layer is larger than a width of its corresponding pixel block in the direction perpendicular to the first side.

7. The display panel of claim 1, wherein the pixel block is formed by a self-luminous light source.

8. The display panel of claim 1, wherein the pixel array layer is disposed on a first substrate; the light-blocking layer is disposed on a second substrate; at least one of the first substrate and the second substrate has an alignment mark for alignment of the first substrate and the second substrate.

9. The display panel of claim 1, wherein at least a portion of the pixel blocks are arranged side by side along a direction parallel to the first side and correspond to a same first light-blocking belt.

* * * * *